(12) United States Patent
Kogure et al.

(10) Patent No.: US 8,970,243 B2
(45) Date of Patent: Mar. 3, 2015

(54) TEST CARRIER AND BOARD ASSEMBLY

(75) Inventors: Yoshinari Kogure, Saitama (JP);
Takashi Fujisaki, Gunma (JP); Kiyoto Nakamura, Miyagi (JP)

(73) Assignee: Advantest Corporation, Tokyo (JP)

( * ) Notice: Subject to any disclaimer, the term of this patent is extended or adjusted under 35 U.S.C. 154(b) by 168 days.

(21) Appl. No.: 13/448,839

(22) Filed: Apr. 17, 2012

(65) Prior Publication Data

US 2012/0268157 A1 Oct. 25, 2012

(30) Foreign Application Priority Data

Apr. 20, 2011 (JP) ................................. 2011-93867
Oct. 27, 2011 (JP) ............................... 2011-236482

(51) Int. Cl.
*G01R 31/00* (2006.01)
*G01R 1/04* (2006.01)
*G01R 31/28* (2006.01)

(52) U.S. Cl.
CPC .......... *G01R 1/0408* (2013.01); *G01R 31/2893* (2013.01)
USPC ...... 324/756.07; 324/503; 324/509; 324/755; 324/757; 324/761; 439/66; 439/67; 439/68; 439/73; 439/264; 361/810; 361/816; 361/818; 361/641; 361/644

(58) Field of Classification Search
CPC ......... G01R 31/00; G01R 31/27; G01L 23/06
USPC .......... 324/755, 756, 756.07, 756.02, 750.09, 324/756.05, 755.05, 750.08, 754.14, 757, 324/754, 758, 760, 761, 765, 72.5, 158.1, 324/764, 503, 509; 257/710, 729, 48, 678, 257/704, 727, 723, 706, 726; 439/66–73, 439/264; 361/810, 816, 818, 641, 644
See application file for complete search history.

(56) References Cited

U.S. PATENT DOCUMENTS

| 5,355,079 | A | * | 10/1994 | Evans et al. .............. 324/755.05 |
| 5,468,157 | A | * | 11/1995 | Roebuck et al. .............. 439/264 |
| 5,672,908 | A | | 9/1997 | Fujitsu |
| 5,745,346 | A | * | 4/1998 | Ogawa et al. ................. 361/769 |
| 5,757,199 | A | | 5/1998 | Maruyama |
| 5,767,689 | A | | 6/1998 | Tokuno et al. |

(Continued)

FOREIGN PATENT DOCUMENTS

| JP | 7-263504 | 10/1995 |
| JP | 8-172117 | 7/1996 |

(Continued)

OTHER PUBLICATIONS

Korea (10-2012-0036685) Office action, mail date is Jul. 17, 2013.

(Continued)

*Primary Examiner* — Arleen M Vazquez
*Assistant Examiner* — Neel Shah
(74) *Attorney, Agent, or Firm* — Greenblum & Bernstein, P.L.C.

(57) ABSTRACT

A test carrier 10A comprises: a base board 21A which holds a die 90; and a cover board 31A which is laid over the base board 21A so as to cover the die 90. The test carrier 10A comprises a seal member 24 which is interposed between the base board 21A and the cover board 31A and which surrounds the die 90.

7 Claims, 23 Drawing Sheets

(56) References Cited

U.S. PATENT DOCUMENTS

| | | | | |
|---|---|---|---|---|
| 5,828,224 | A | * | 10/1998 | Maruyama ............... 324/756.02 |
| 5,986,459 | A | * | 11/1999 | Fukaya et al. ........... 324/756.02 |
| 6,049,215 | A | * | 4/2000 | Agahdel et al. .......... 324/754.14 |
| 6,127,833 | A | * | 10/2000 | Wu et al. .................. 324/756.02 |
| 6,445,200 | B2 | * | 9/2002 | Haseyama ............... 324/750.09 |
| 6,469,909 | B2 | * | 10/2002 | Simmons ...................... 361/803 |
| 6,492,829 | B1 | | 12/2002 | Miura et al. |
| 6,639,416 | B1 | * | 10/2003 | Akram et al. ............ 324/756.05 |
| 6,753,614 | B2 | | 6/2004 | Yamazaki et al. |
| 6,876,073 | B2 | | 4/2005 | Miura et al. |
| 6,924,211 | B2 | | 8/2005 | Yamazaki et al. |
| 6,972,486 | B2 | * | 12/2005 | Lam et al. ...................... 257/710 |
| 7,463,496 | B2 | * | 12/2008 | Robinson et al. ............. 361/818 |
| 7,534,045 | B2 | * | 5/2009 | Nakajima et al. ............. 384/448 |
| 7,838,975 | B2 | | 11/2010 | Chen |
| 2002/0140063 | A1 | | 10/2002 | Yamazaki et al. |
| 2002/0140093 | A1 | | 10/2002 | Yamazaki et al. |
| 2003/0020158 | A1 | | 1/2003 | Miura et al. |
| 2003/0140485 | A1 | | 7/2003 | Yamazaki et al. |
| 2003/0226640 | A1 | | 12/2003 | Yamazaki et al. |
| 2004/0012098 | A1 | | 1/2004 | Yamazaki et al. |
| 2005/0093558 | A1 | | 5/2005 | Hembree |
| 2005/0282313 | A1 | | 12/2005 | Akram et al. |
| 2007/0189568 | A1 | | 8/2007 | Wilk et al. |

FOREIGN PATENT DOCUMENTS

| | | |
|---|---|---|
| JP | 10-68758 | 3/1998 |
| KR | 0165154 | 2/1999 |
| TW | 544734 | 8/2003 |
| TW | 546682 | 8/2003 |
| TW | 256395 | 1/2014 |
| WO | 2010/109739 | 9/2010 |

OTHER PUBLICATIONS

Korea (10-2012-0036686) Office action, mail date is Jul. 17, 2013.
Taiwan (101109436) Office action, dated Jan. 24, 2014 along with an english translation thereof.
Taiwan (101109439) Office action, dated Jan. 24, 2014 along with an english translation thereof.
Japan (JP Appl. No. 2011-236483) Office action, mail date is Jul. 15, 2014.
Japan (JP Appl. No. 2011-236482) Office action, mail date is Jul. 15, 2014.
Final Official Action in U.S. Appl. No. 13/448,911 dated Jul. 23, 2014.
U.S.A. (U.S. Appl. No. 13/448,911) Office action, mail date is Mar. 11, 2014.
Taiwan Office action in TW 101109436, dated Aug. 28, 2014.

* cited by examiner

TEST CARRIER AND BOARD ASSEMBLY

TECHNICAL FIELD

The present invention relates to a test carrier on which a die chip is temporarily mounted for testing an integrated circuit device or other electronic circuit device which is formed in the die chip and relates to a board assembly of that test carrier.

The present application claims priority from Japanese Patent Application No. 2011-93867 filed on Apr. 20, 2011 and Japanese Patent Application No. 2011-236482 filed on Oct. 27, 2011. The contents described and/or illustrated in the documents relevant to the Japanese Patent Application No. 2011-93867 and Japanese Patent Application No. 2011-236482 will be incorporated herein by reference as a part of the description and/or drawings of the present application.

BACKGROUND ART

As a test package which temporarily packages a chip-like device which is cut from a wafer, there is known one which clamps the device between a first board and a second board and sucks out the gas between the first board and second board to seal the device inside of the test package (for example, see PLT 1).

CITATIONS LIST

Patent Literature

PLT 1: WO 2010/109739

SUMMARY OF INVENTION

Technical Problem

In the above test package, the atmospheric pressure of the outside world is utilized to make the device terminals and the board side terminals contact each other, so the space which is formed between the first board and the second board is required to have a high air-tightness.

The problem to be solved by the present invention is to provide a test carrier which can secure a high air-tightness and to provide a board assembly of such a test carrier.

Solution to Problem

[1] A test carrier according to the present invention is a test carrier comprising: a base board which holds an electronic device; a cover board which is laid over the base board so as to cover the electronic device; and a seal member which is interposed between the base board and the cover board and surrounds the electronic device.

[2] In the above invention, the seal member may comprise a ring-shaped elastic member which has electrical conductivity.

[3] In the above invention, the base board or the cover board may have an adhesive member which is adhered to the seal member.

[4] In the above invention, the seal member may have a groove in which part of the cover board or the base board is inserted.

[5] In the above invention, the base board or the cover board may have a flat part which contacts the seal member.

[6] In the above invention, the seal member may comprise a paste-form gel material or a sheet-shaped gel material.

[7] In the above invention, the electronic device may be a die which is formed by dicing a semiconductor wafer.

[8] In the above invention, an accommodation space which is formed between the base board and the cover board and which accommodates the electronic device may be reduced in pressure compared with the outside air.

[9] A board assembly according to the present invention is a board assembly of a test carrier, the board assembly comprising: a board; a ring-shaped seal member; and an adhesive member which is provided on the board and which adheres to the seal member.

[10] In the above invention, the seal member may comprise an elastic material which has electrical conductivity.

[11] A board assembly according to the present invention is a board assembly of a test carrier, the board assembly comprising: a board; and a ring-shaped seal member, wherein the seal member has a groove in which part of the board is inserted.

[12] In the above invention, the seal member may comprise an elastic material which has electrical conductivity.

Advantageous Effects of Invention

In the present invention, a seal member is interposed between the base board and the cover board, so a high air-tightness can be secured.

DESCRIPTION OF EMBODIMENTS

Below, embodiments of the present invention will be explained based on the drawings.

First Embodiment

Figure 1:
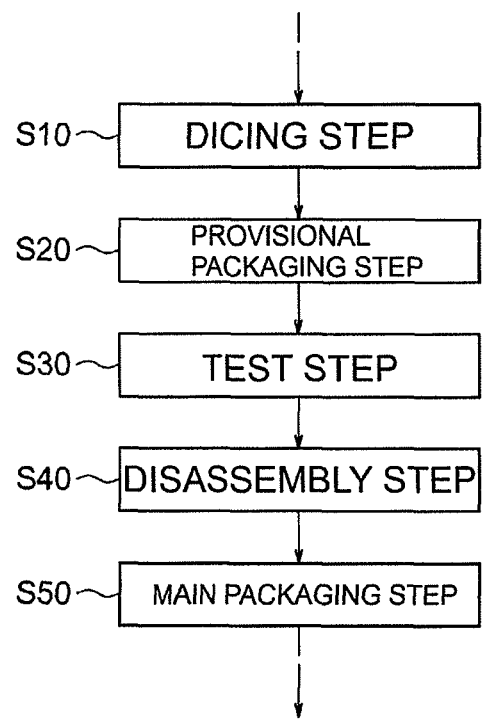
FIG. 1 is a flowchart which shows part of a process of production of a device in an embodiment of the present invention.

FIG. 1 is a flowchart showing part of a process of production of a device in a first embodiment of the present invention.

In the present embodiment, after a semiconductor wafer is diced (after step S10 of FIG. 1) and before final packaging (before step S50), an integrated circuit or other electronic circuit which is built into the die 90 is tested (steps S20 to S40).

In the present embodiment, first, the die 90 is temporarily mounted on a test carrier 10A (step S20). Next, through this test carrier 10A, the die 90 is electrically connected to a test system (not shown) to thereby run a test on the electronic circuit formed in the die 90 (step S30). Further, after this test is finished, the test carrier 10A is disassembled to take out the die 90 from the carrier 10A (step S40), then this die 90 is packaged by main packaging whereby the device is completed as a final product.

Below, a test carrier 10A on which a die 90 is temporarily mounted (provisionally packaged) in the first embodiment of the present invention will be explained.

Figure 4:
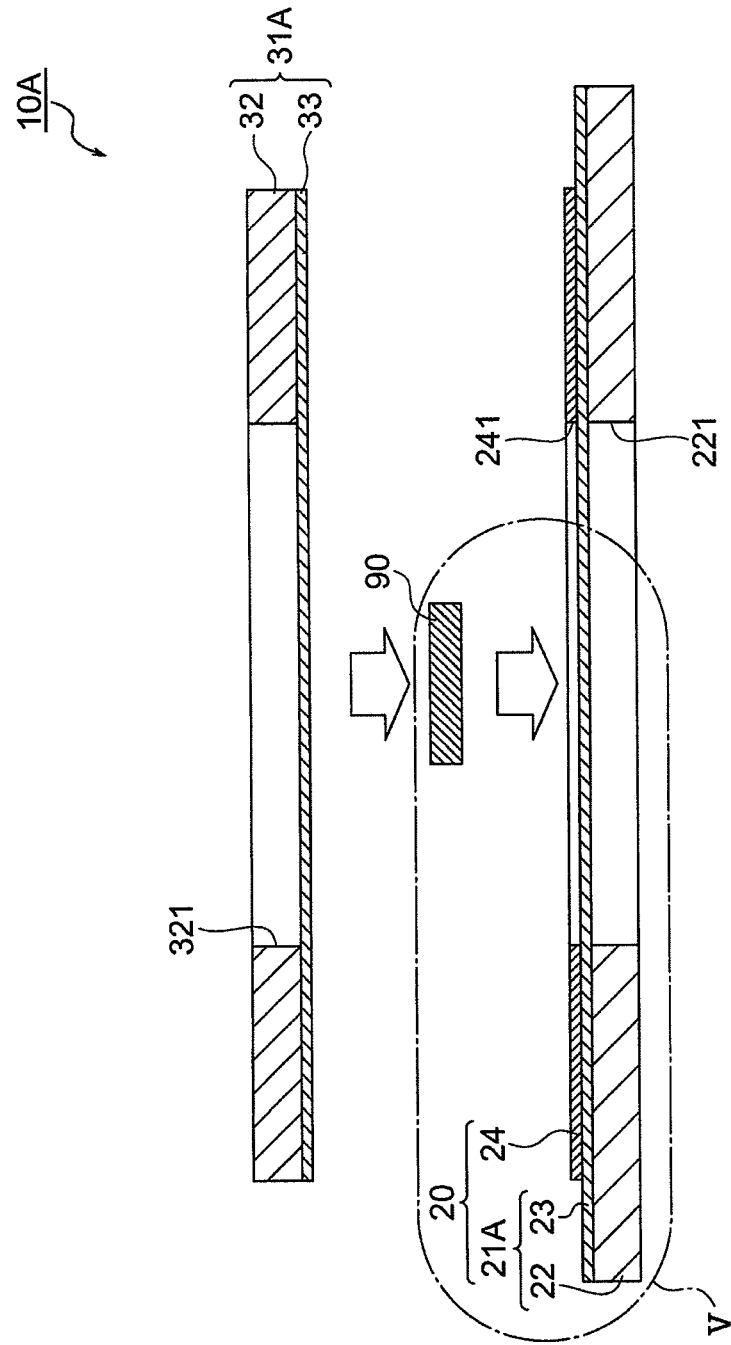
FIG. 4 is a disassembled cross-sectional view which shows a test carrier in a first embodiment of the present invention.
Figure 5:
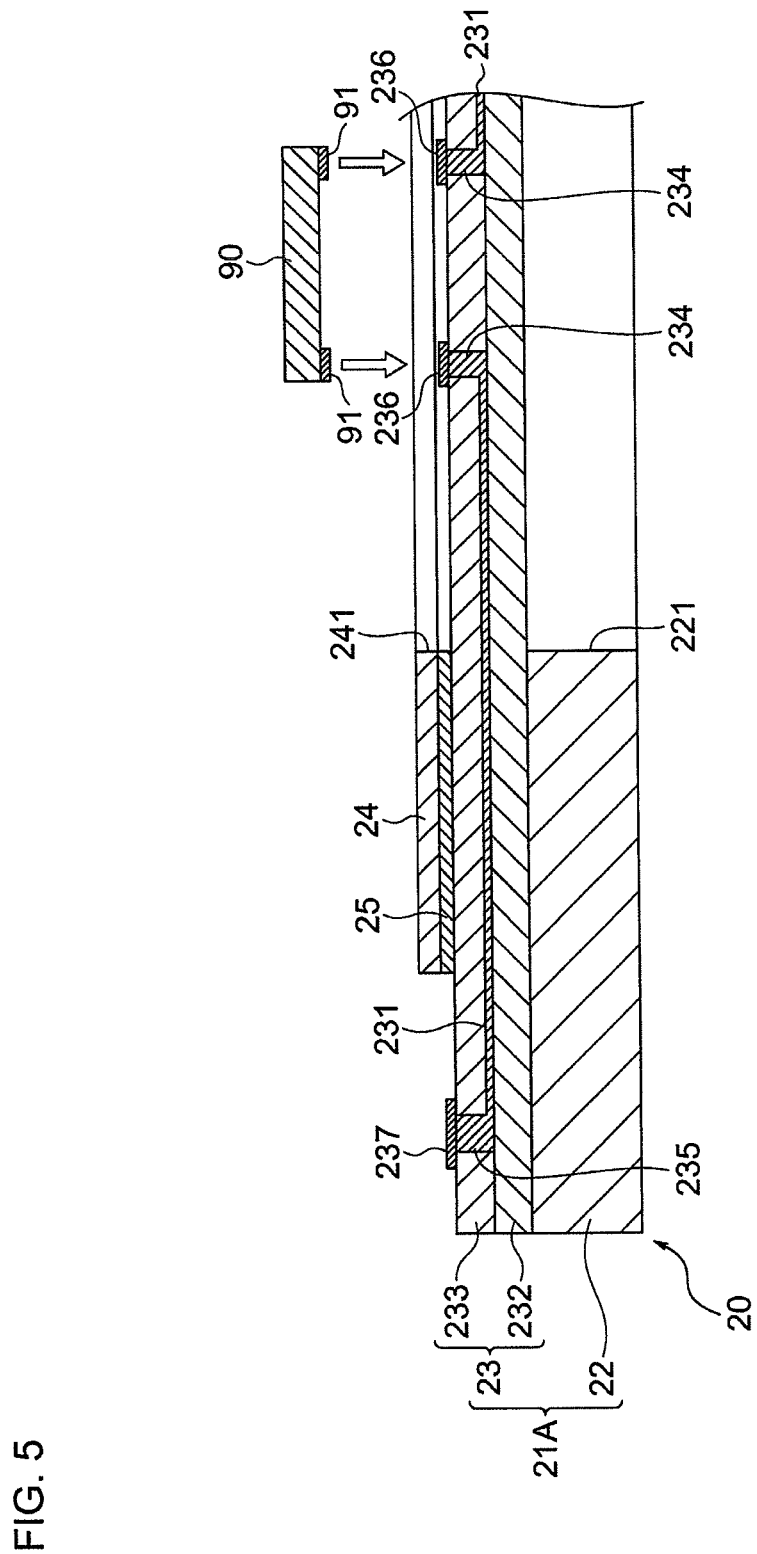
FIG. 5 is an enlarged view of part V in FIG. 4.
Figure 6:
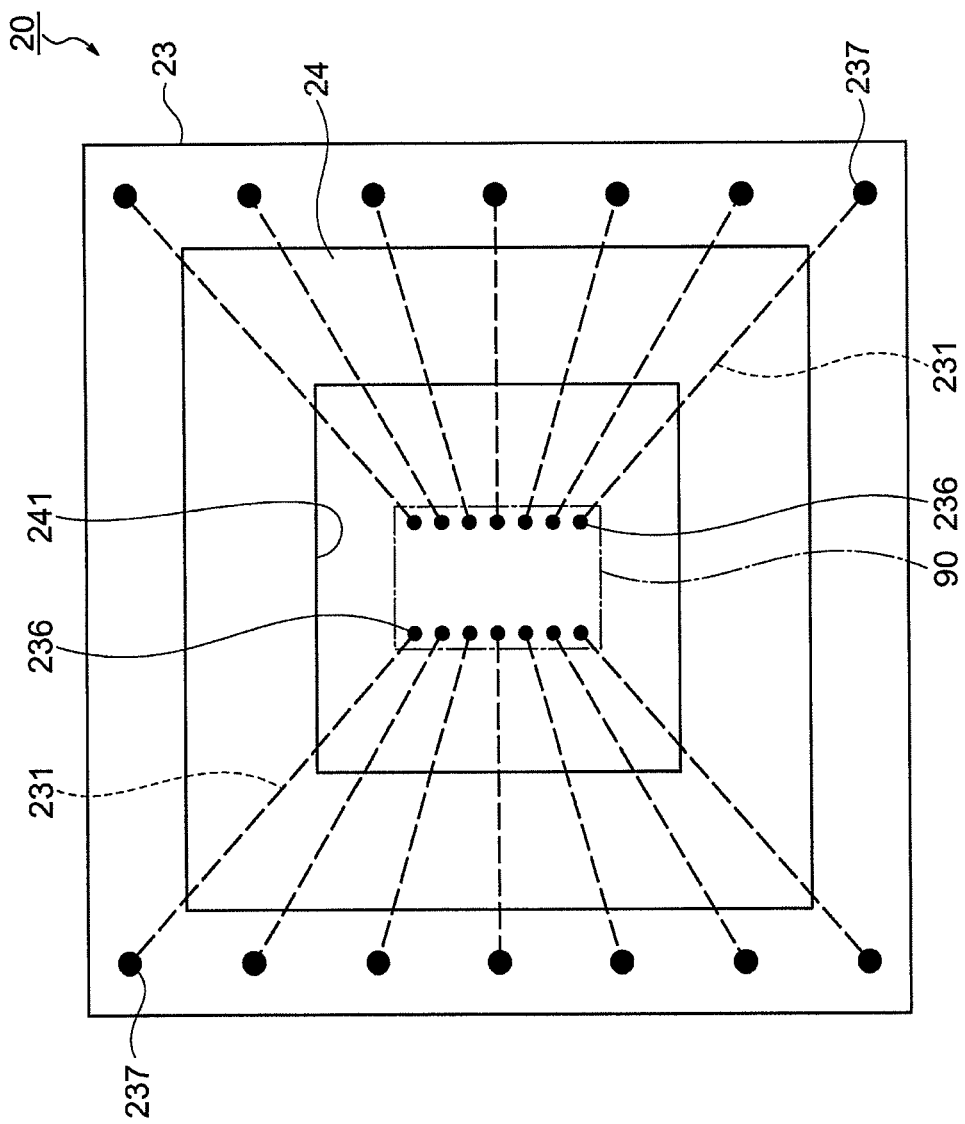
FIG. 6 is a plan view which shows a base board assembly of the test carrier in the first embodiment of the present invention.
Figure 7:
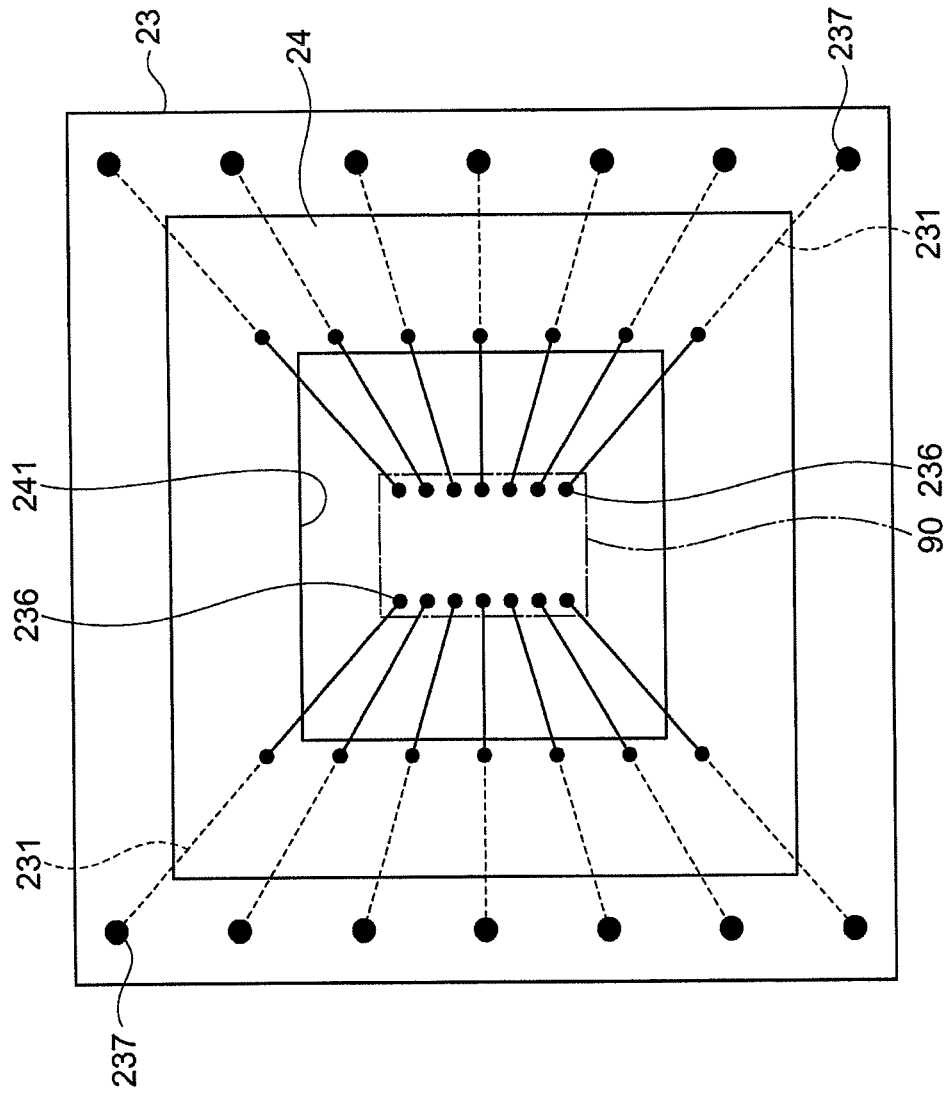
FIG. 7 is a plan view which shows a modification of the interconnect patterns in the first embodiment of the present invention.

FIG. 2 to FIG. 5 are views which show a test carrier in the present embodiment, FIG. 6 is a view which shows a base board assembly of that test carrier, FIG. 7 is a view which shows a modification of the interconnect patterns, and FIG. 8 to FIG. 13 are cross-sectional views which show modifications of the test carrier in the present embodiment.

Figure 2:
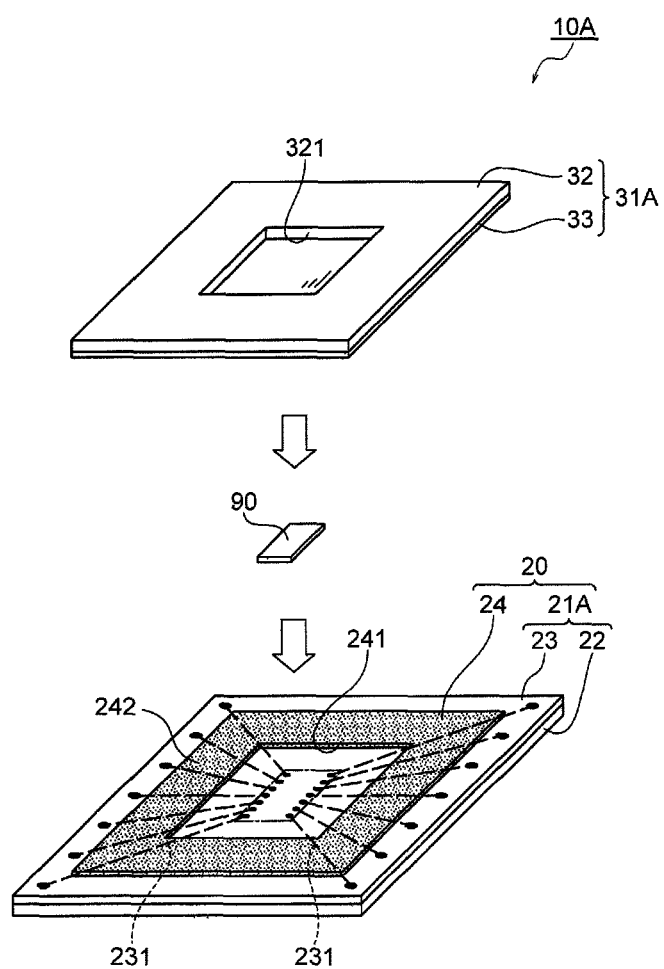
FIG. 2 is a disassembled perspective view which shows a test carrier in a first embodiment of the present invention.
Figure 3:
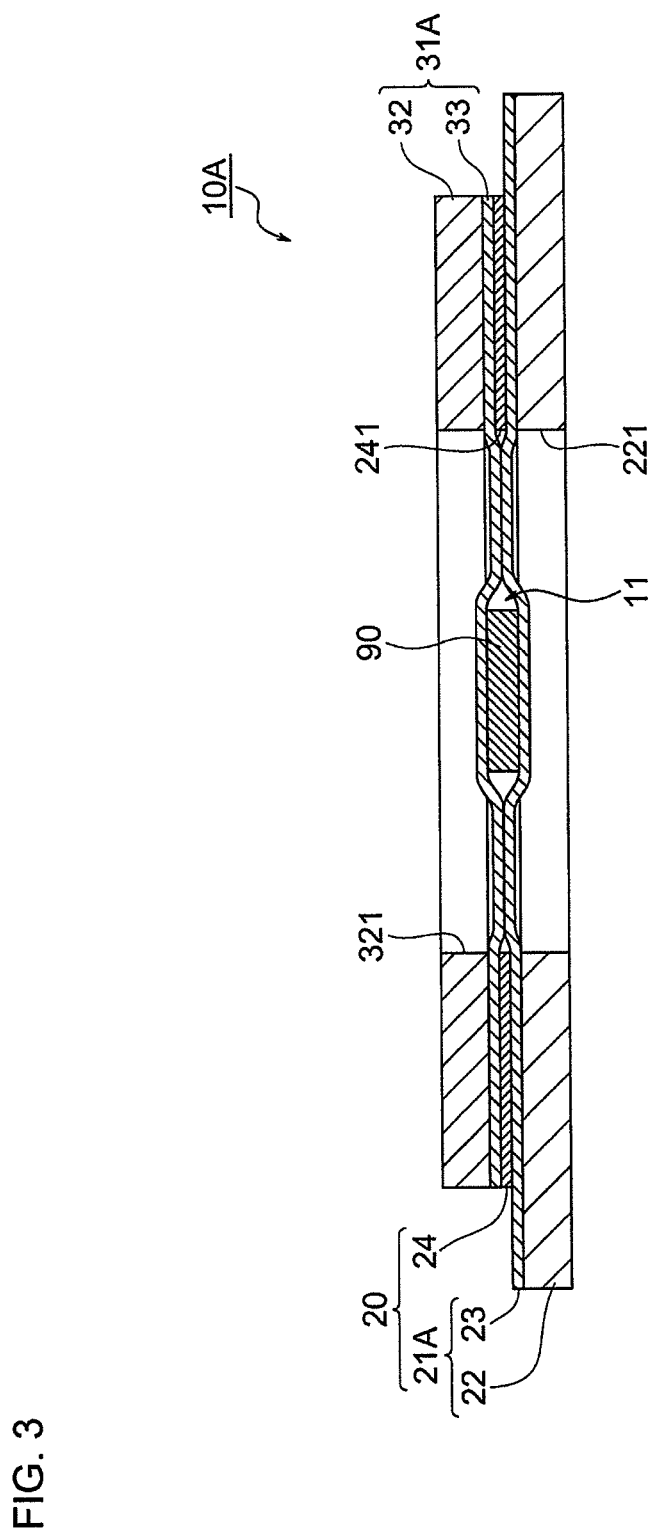
FIG. 3 is a cross-sectional view which shows a test carrier in a first embodiment of the present invention.

The test carrier 10A in the present embodiment, as shown in FIG. 2 to FIG. 4, comprises: a base board assembly 20 on which a die 90 is to be placed; and a cover board 31A which is laid over this base board assembly 20 so as to cover the die 90. This test carrier 10A holds the die 90 by clamping the die 90 between the base board assembly 20 and the cover board 31A in a state reduced in pressure from atmospheric pressure.

The base board assembly 20 comprises a base board 21A and a seal member 24. The base board 21A has a base frame 22 and a base film 23.

The base frame 22 is a rigid board which has a high rigidity (at least a rigidity higher than the base film 23 and the cover film 33) and which is formed with a rectangular opening 221 at its center. This base frame 22 is, for example, composed of a polyamide imide resin, ceramic, glass, etc.

The base film 23 is a film which has pliability and is adhered to the entire surface of the base frame 22, including the center opening 221, by a binder (not shown). In this way, in the present embodiment, the base film 23 which has pliability has the highly rigid base frame 22 adhered to it, so the handling ability of the base board 21A is improved.

As shown in FIG. 5, this base film 23 has: a base layer 232 on which first interconnect patterns 231 are formed; and a cover layer 233 which covers this base layer 232. Both of the base layer 232 and cover layer 233 of the base film 23 comprise, for example, a polyimide film etc. The interconnect patterns 231 are, for example, formed by etching copper foil which is laminated on the base layer 232.

As shown in FIG. 5 and FIG. 6, one end of each of the interconnect patterns 231 is connected to a pad 236 through a through hole 234 of the cover layer 233. This pad 236 is connected to an electrode 91 of the die 90. On the other hand, the other end of each interconnect pattern 231 is connected to an external terminal 237 through a through hole 235 of the cover layer 233. The external terminal 237 is contacted by a contact pin of the test system when testing the electronic circuit of the die 90.

The seal member 24 of the base board assembly 20, as shown in FIG. 2 to FIG. 4, is a ring-shaped elastic member which is provided on the above-mentioned base board 21A and which has electrical conductivity. This seal member 24 is, for example, composed of electroconductive rubber containing carbon black or metal powder or other conductors 242 which are added to a rubber material. Specifically, electroconductive silicone rubber may be illustrated.

This seal member 24 has an inside hole 241 of a shape corresponding to the center opening 221 of the base frame 22. Further, as shown in FIG. 5, this seal member 24 is adhered on to the base film 23 through an adhesive member 25 so that the center opening 221 and the inside hole 241 are substantially aligned when viewed by a plan view. This adhesive member 25 has an electrical insulating ability. Specifically, for example, a two-sided tape which has adhesive layers on both surfaces of a substrate, a binder, etc. may be mentioned. Note that, it is also possible to directly adhere the seal member 24 on to the base film 23 without an adhesive member 25.

As the seal member 24, a paste-form or sheet-shaped gel material may also be used. As specific examples of such a gel material, for example, a gel material made principally of silicone (for example, αGEL® made by Taica Corporation) may be mentioned.

When using a paste-form gel material as the seal member 24, it is sufficient to directly coat the gel material on the base film 23. On the other hand, when using a sheet-shaped gel material as the seal member 24, the gel material is adhered to the base film 23 through an adhesive member 25 or the gel material is directly adhered to the base film 23 without an adhesive member 25.

On the other hand, the cover board 31A of the test carrier 10A also comprises a cover frame 32 and a cover film 33.

The cover frame 32 is a rigid board which has a high rigidity (at least a rigidity higher than the base film 23 and the cover film 33) and which is formed with a rectangular opening 321 at its center. This cover frame 32 is, in the same way as the base frame 22, for example, composed of a polyamide imide resin, ceramic, glass, etc.

The cover film 33 is for example a polyimide film or other film which has pliability. It is attached over the entire surface of the cover frame 32, including the center opening 321, by a binder (not shown). In this way, in the present embodiment, the cover film 33 which has pliability has the high rigidity cover frame 32 adhered to it, so the handling ability of the cover board 32A is improved. Incidentally, the cover film 33, unlike the above-mentioned base film 23, is not formed with interconnect patterns.

Note that, the above-mentioned seal member 24 may also be adhered through the adhesive member 25 to the cover film 33 instead of the base film 23.

The above explained test carrier 10A is assembled as follows.

That is, first, the electrodes 91 are aligned with the pads 236 and, in that state, the die 90 is placed on the base film 23 of the base board 21A. The die 90 which is placed on the base film 23 is positioned inside of the inside hole 241 of the seal member 24 and is surrounded by the ring-shaped seal member 24. Note that, base board 21A has the seal member 24 attached to it to form the base board assembly 20 in advance.

Next, in an environment reduced in pressure compared with atmospheric pressure, the cover board 31A is placed on the base board 21A through the seal member 24 and the die 90 is inserted between the base board 21A and the cover board 31A. At this time, the cover board 31A is placed over the base board 21A so that the base film 23 and the cover film 33 directly contact each other.

Next, in the state with the die 90 clamped between the base board 21A and the cover board 31A, the test carrier 10A is returned to an atmospheric pressure environment whereby the die 90 is held inside the accommodation space 11 which is formed between the base board 21A and the cover board 31A (see FIG. 3).

Note that, the electrodes 91 of the die 90 and the pads 236 of the base film 23 are not fastened by solder etc. In the present embodiment, the accommodation space 11 is reduced in pressure compared with the outside air, so the base film 23 and the cover film 33 press against the die 90 whereby the electrodes 91 of the die 90 and the pads 236 of the base film 23 contact each other.

Further, in the present embodiment, since the seal member 24 is interposed between the base board 21A and the cover board 31A, the accommodation space 11 which is formed between the base board 21A and the cover board 31A can be improved in air-tightness.

Further, in the present embodiment, by giving the seal member 24 electrical conductivity, it is possible to suppress the generation of static electricity at the time of peeling apart the base board 21A and the cover board 31 at the above-mentioned disassembly step (step S40 of FIG. 1) and it is possible to suppress deterioration or damage of the electronic circuit of the die 90 due to electrostatic discharge (ESD).

Further, in the present embodiment, even if the presence of the interconnect patterns 231 causes the surface of the base film 23 to become uneven, the adhesive member 25 buries the unevenness, so the air-tightness by the seal member 24 can be maintained.

Furthermore, in the present embodiment, by adhering the seal member 24 to the base board 21A to form the base board assembly 20 in advance and by handling that assembly 20 at the time of assembly of the test carrier 10A, the work efficiency is improved.

Note that, the interconnect patterns 231 are not limited to the above configuration. For example, as shown in FIG. 7, part of the interconnect patterns 231 may be formed on the surface of the base film 23 by ink jet printing in real time. Alternatively, all of the interconnect patterns 231 may be formed by ink jet printing.

In the present embodiment, even if the seal member 24 which has electrical conductivity is positioned on interconnect patterns 231 which are exposed on the base film 23, since the adhesive member 25 which has electrical insulating ability is interposed between the seal member 24 and the interconnect patterns 231, the electrical insulating ability between them is secured.

Note that, the positions of the pads 236 and the positions of the external terminals 237 are not particularly limited. They may be configured as shown in FIG. 8 to FIG. 13 explained below or may be configured by combining these.

Figure 8:
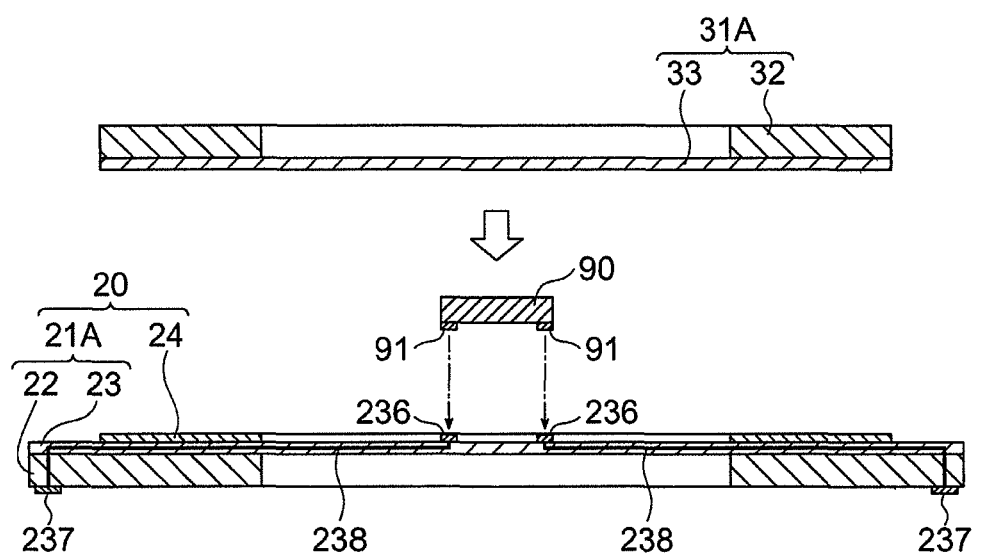
FIG. 8 is a disassembled cross-sectional view which shows a first modification of the test carrier in the first embodiment of the present invention.

For example, like in the first modification which is shown in FIG. 8, it is also possible to form the pads 236 on the top surface of the base film 23 and form the external terminals 237 on the bottom surface of the base frame 22. In this case, conduction paths 238 which connect the pads 236 and the external terminals 237 are formed on the base film 23 and the base frame 22.

Figure 9:
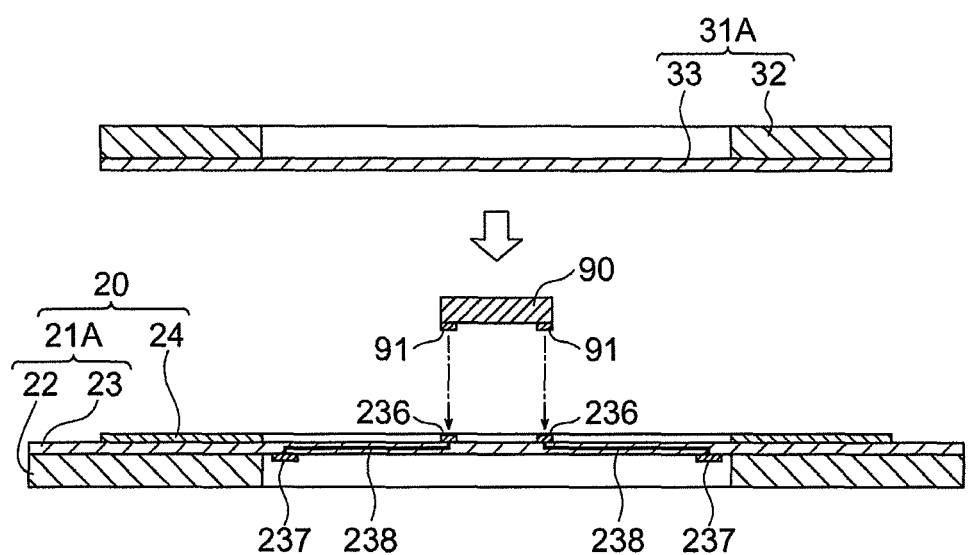
FIG. 9 is a disassembled cross-sectional view which shows a second modification of the test carrier in the first embodiment of the present invention.

Further, like in the second modification which is shown in FIG. 9, it is also possible to form the pads 236 on the top surface of the base film 23 and form the external terminals 237 on the bottom surface of the base film 23. In this case, the conduction paths 238 are formed on the base film 23.

Figure 10:
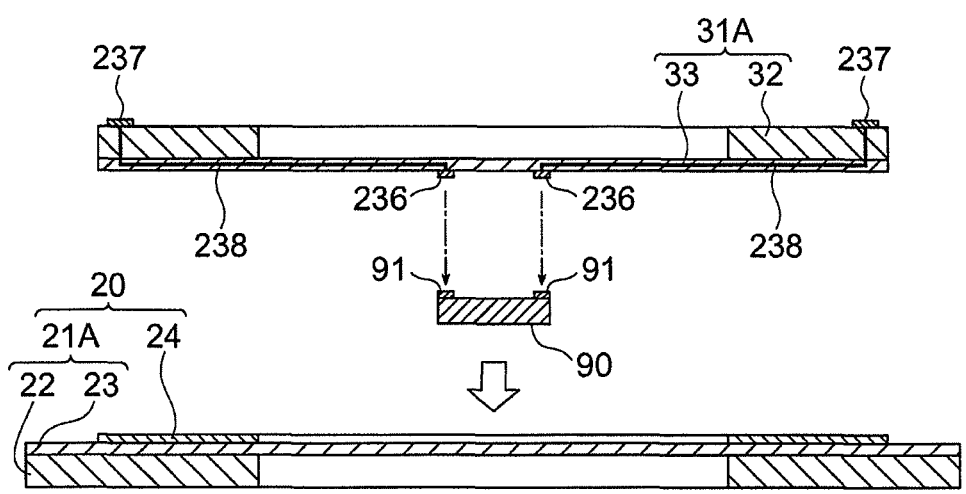
FIG. 10 is a disassembled cross-sectional view which shows a third modification of the test carrier in the first embodiment of the present invention.

Further, like in the third modification which is shown in FIG. 10, it is also possible to form the pads 236 on the bottom surface of the cover film 33 and form the external terminals 237 on the top surface of the cover frame 32. In this case, the conduction paths 238 are formed on the cover film 33 and the cover frame 32. Note that, while not particularly shown, a procedure similar to that of the example which is shown in FIG. 9 may be used to form the external terminals 237 on the top surface of the cover film 33.

Figure 11:
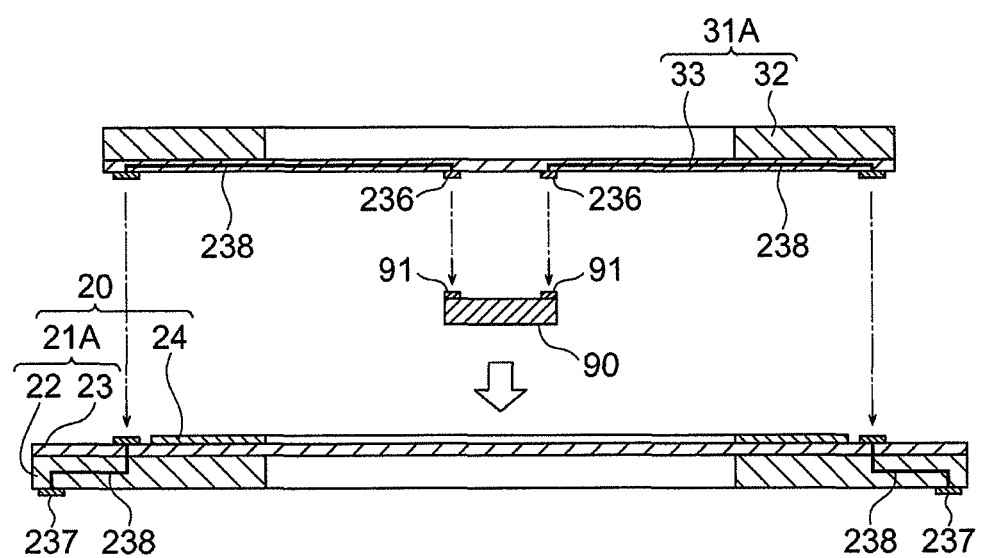
FIG. 11 is a disassembled cross-sectional view which shows a fourth modification of the test carrier in the first embodiment of the present invention.

Further, like in the fourth modification which is shown in FIG. 11, it is also possible to form the pads 236 on the bottom surface of the cover film 33 and form the external terminals 237 on the bottom surface of the base frame 22. In this case, the conduction paths 238 are formed on the cover film 33, the base film 23, and the base frame 22.

Figure 12:
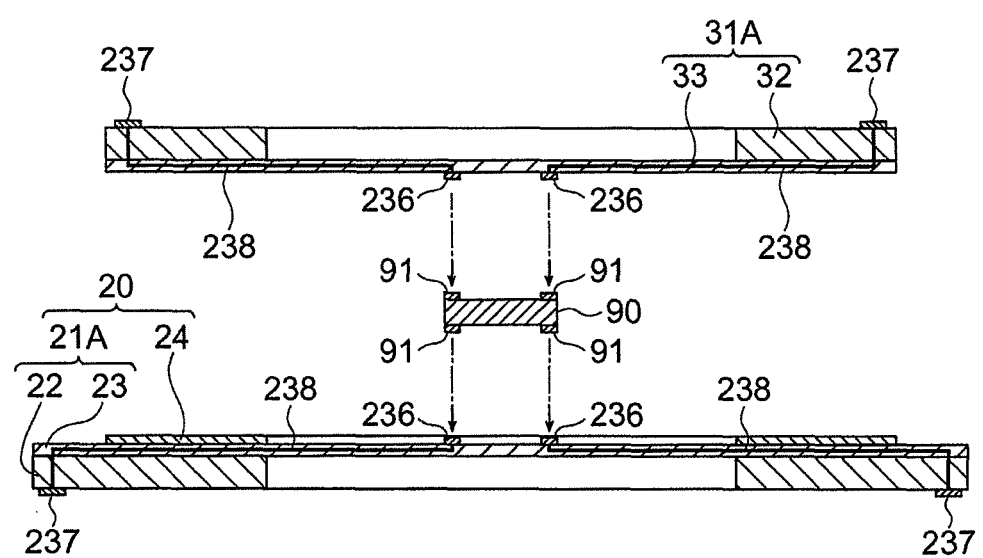
FIG. 12 is a disassembled cross-sectional view which shows a fifth modification of the test carrier in the first embodiment of the present invention.

Furthermore, when the die 90 has electrodes 91 on its top surface and bottom surface, like in the fifth modification which is shown in FIG. 12, it is also possible to form the pads 236 on both the base film 23 and cover film 33 and form the external terminal 237 on both the base frame 22 and cover frame 32.

Figure 13:
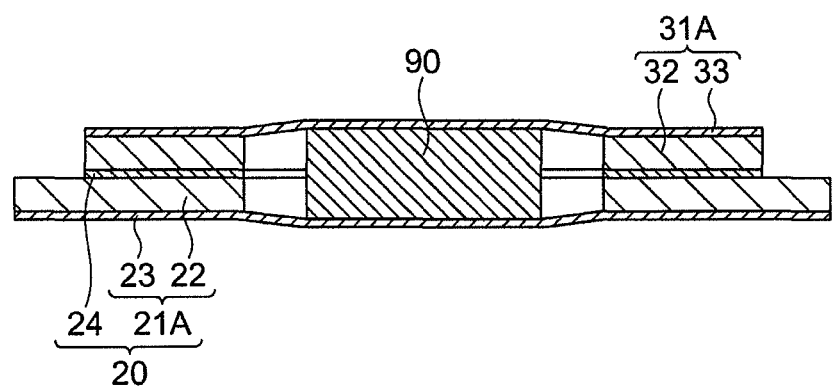
FIG. 13 is a disassembled cross-sectional view which shows a sixth modification of the test carrier in the first embodiment of the present invention.

Further, when the die 90 is relatively thick, like in the sixth modification which is shown in FIG. 13, the cover board 31A may be laid over the base board 21A so that the base frame 22 and the cover frame 32 face each other across the seal member 24.

Second Embodiment

Figure 14:
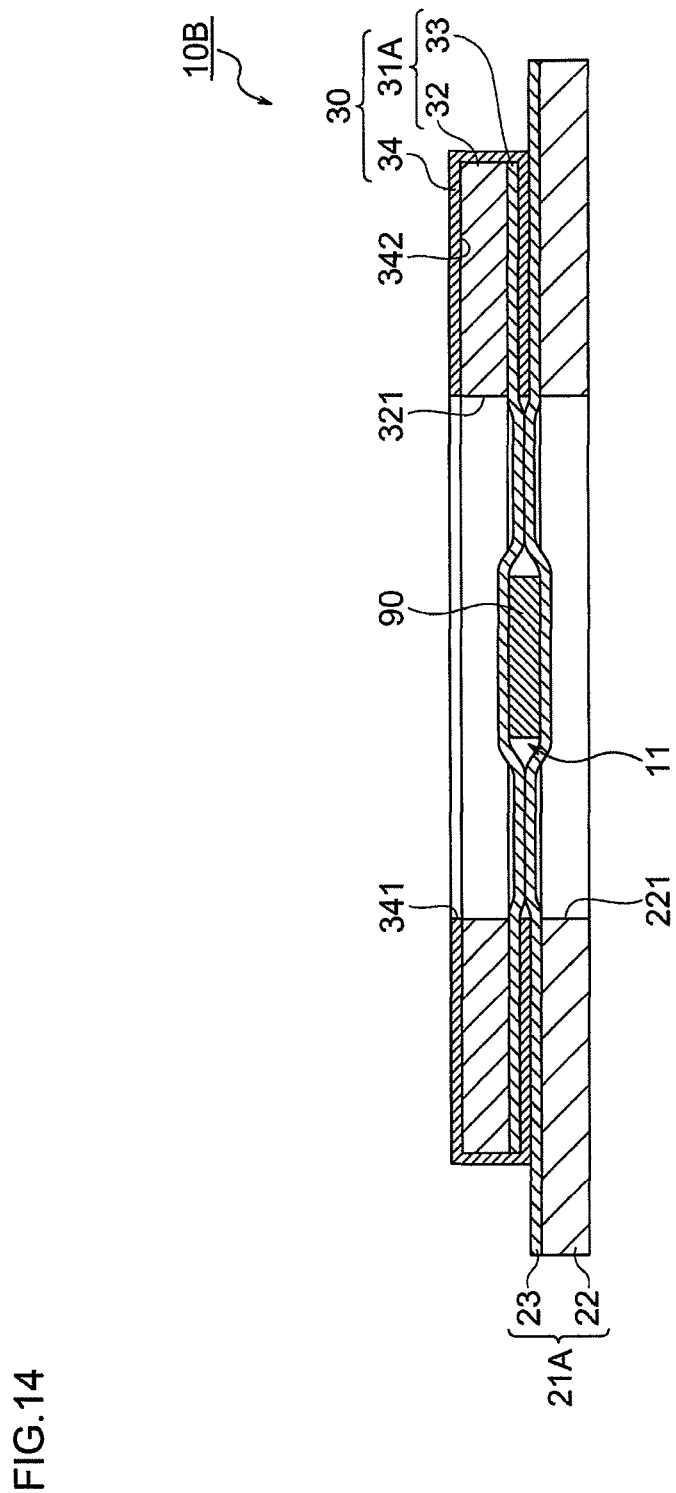
FIG. 14 is a cross-sectional view which shows a test carrier in a second embodiment of the present invention.
Figure 15:
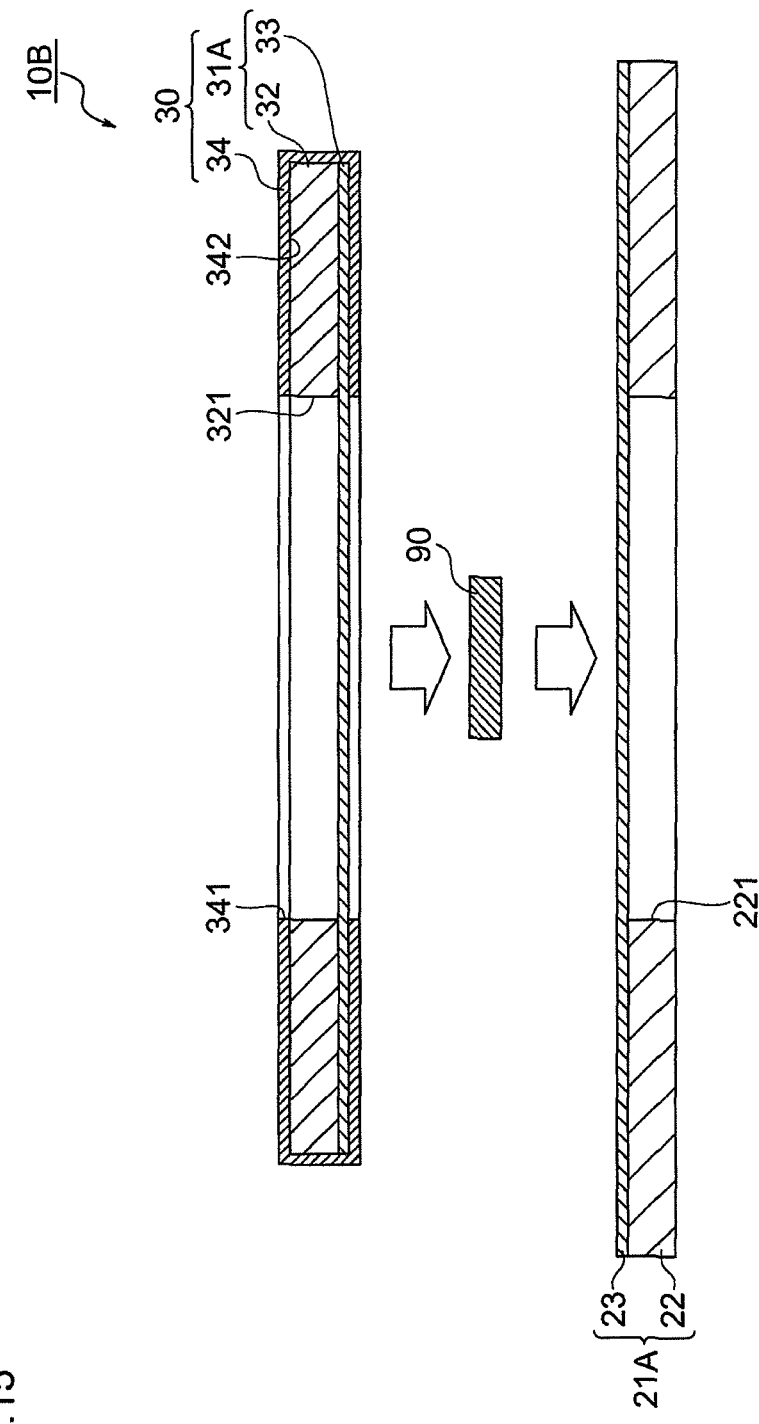
FIG. 15 is a disassembled cross-sectional view which shows a test carrier in the second embodiment of the present invention.

FIG. 14 and FIG. 15 are views which show a test carrier in a second embodiment of the present invention.

As shown in FIG. 14, the test carrier 10B in the present embodiment comprises a base board 21A and a cover board assembly 30. The cover board assembly 30 has a cover board 31A and a seal member 34.

Note that, the base board 21A and cover board 31A in the present embodiment are similar to those of the first embodiment, so the same reference notations are assigned and explanations are omitted.

The seal member 34 of the cover board assembly 30, as shown in FIG. 14 and FIG. 15, is a ring-shaped elastic member which is attached to the cover board 31A and which has electrical conductivity. This seal member 34, like the seal member 24 which is explained in the first embodiment, for example, is composed of electroconductive rubber containing carbon black or metal powder or other conductors which are added to a rubber material. Specifically, electroconductive silicone rubber may be illustrated.

This seal member 34 has an inside hole 341 of a shape corresponding to the center opening 321 of the cover frame 22. Further, this seal member 34 has an inner circumferential groove 342 in which the outer circumferential part of the cover board 31A is inserted across the entire circumference.

Note that, in the example which is shown in FIG. 14 and FIG. 15, the entire cover frame 32 of the cover board 31A is inserted into the inner circumferential groove 342 of the seal member 34, but the invention is not particularly limited to this. It is also possible to insert only the outer circumferential part of the cover frame 32 into the inner circumferential groove 342.

The test carrier 10B in the present embodiment is assembled in the same way as the test carrier 10A in the above-mentioned first embodiment, but it differs from the first embodiment in the point that the seal member 34 is attached to the cover board 31A in advance to form the cover board assembly 30.

In the present embodiment, in the same way as the first embodiment, the seal member 34 is interposed between the base board 21A and the cover board 31A, so the accommodation space 11 which is formed between the base board 21A and the cover board 31A can be improved in air-tightness.

Further, in the present embodiment, like in the first embodiment, by giving the seal member 34 electrical conductivity, it is possible to suppress deterioration or damage of the electronic circuit of the die 90 due to ESD at the above-mentioned disassembly step (step S40 of FIG. 1).

Furthermore, in the present embodiment, by adhering the seal member 34 to the cover board 31A to form the cover board assembly 30 in advance and by handling that assembly 30 at the time of assembly of the test carrier 10B, the work efficiency is improved.

In particular, in the present embodiment, the outer circumferential part of the cover board 31A is inserted into the inner circumferential groove 342 of the seal member 34, so the adhesive member for attaching the seal member 34 to the cover board 31A becomes unnecessary.

Note that when the die 90 is relatively thick, the cover board 31B may be laid over the base board 21A so that the base frame 22 and the cover frame 32 face each other across the seal member 24.

Figure 16:
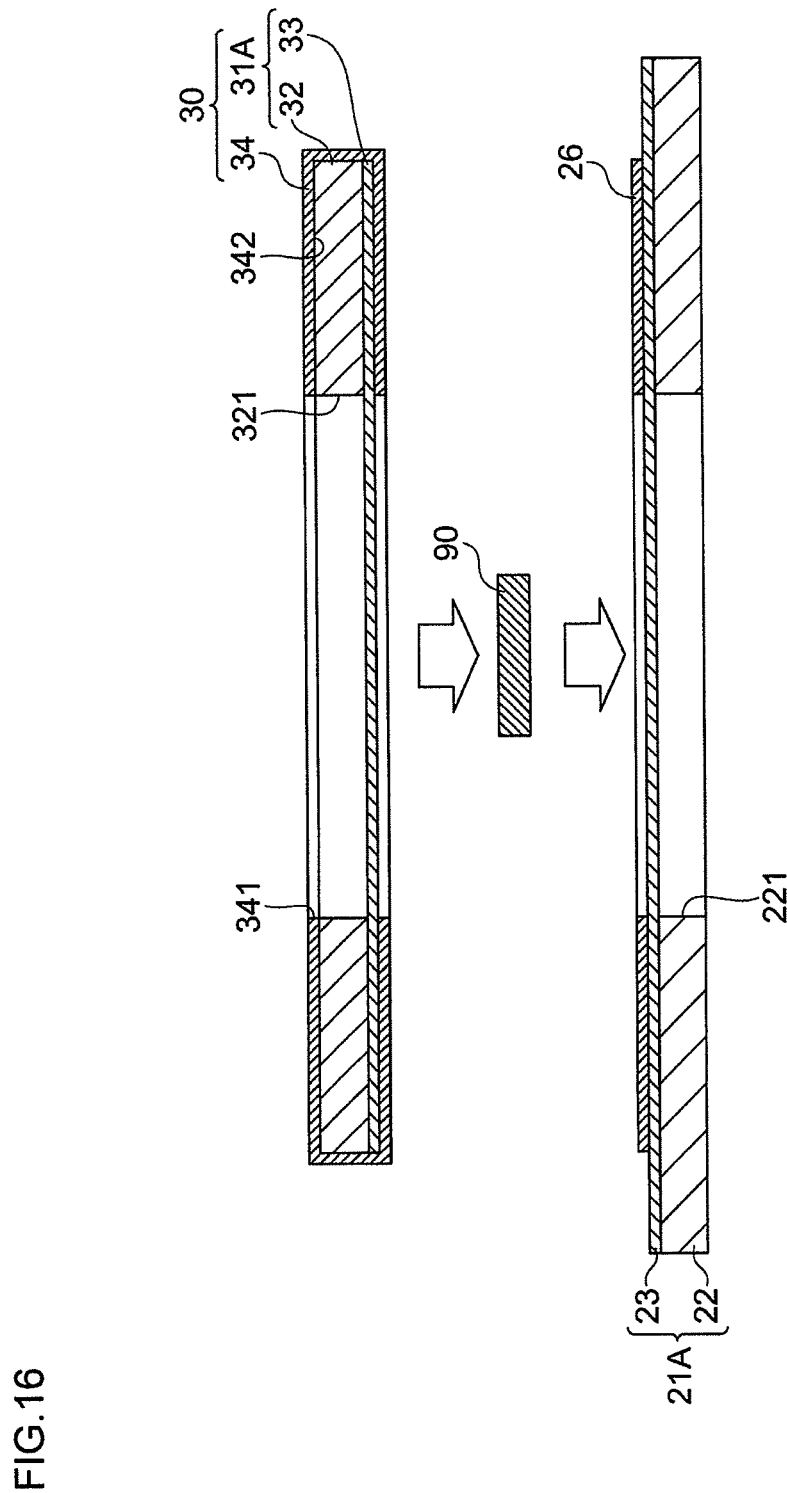
FIG. 16 is a disassembled cross-sectional view which shows a modification of the test carrier in the second embodiment of the present invention.

FIG. 16 is a view which shows a modification of the test carrier in the present embodiment.

Note that, as shown in FIG. 16, it is also possible to interpose an insulating film 26 between the base film 23 and the seal member 34, the insulating film 26 has an electrical insulating ability. This insulating film 26 is adhered to the base film 23 through an adhesive member.

Due to this, even if the presence of interconnect patterns 231 causes the surface of the base film 23 to become uneven, a smooth surface can be secured by the insulating film 26, so the air-tightness by the seal member 34 can be maintained.

Further, even if the interconnect patterns 231 are exposed on the base film 23, the insulating film 26 which has an electrical insulating ability is interposed between the interconnect patterns 231 and the seal member 34, so the electrical insulating ability between the seal member 34 and the interconnect patterns 231 is secured.

Note that, instead of the insulating film 26, it is also possible to adhere one-sided tape which has an adhesive layer on only one surface of a substrate to a position of the base film 23 corresponding to the seal member 34 or to print solder resist etc. so as to secure a smooth surface. The insulating film 26, one-sided tape, or solder resist in the present embodiment corresponds to one example of the flat part in the present invention.

Further, the above-mentioned seal member 34 may be attached to the base board 21A instead of the cover board 31A. In this case, to improve the adhesion of the seal member 34, the insulating film 26 may be interposed between the cover film 33 and the seal member 34.

Third Embodiment

Figure 17:
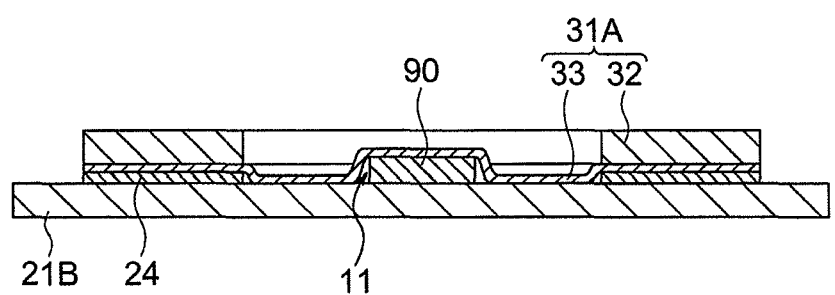
FIG. 17 is a disassembled cross-sectional view which shows a test carrier in the third embodiment of the present invention.

FIG. 17 is a view which shows a test carrier in a third embodiment of the present invention.

In the present embodiment, the configuration of the base board differs from the first embodiment, but the rest of the configuration is similar to the first embodiment.

As shown in FIG. 17, the base board 21B in the present embodiment has a high rigidity (a rigidity higher than at least the cover film 33), but comprises only a flat plate shaped rigid board which does not have a center opening. This base board 21B is, for example, composed of a polyamide imide resin, ceramic, glass, etc. Note that, while not particularly shown, the base board 21B may, for example, be configured by a single-layer or a multi-layer printed circuit board so as to enable formation of interconnect patterns 231 on the base board 21B.

In this embodiment as well, the seal member 24 is interposed between the base board 21B and the cover board 31A, and the die 90 which is held between the base board 21B and the cover board 31A is surrounded by the ring-shaped seal member 24. Note that, as explained in the first embodiment, an adhesive member may be used to adhere the seal member 24 to the base board 21B or the cover board 31A in advance.

In the present embodiment, like in the first embodiment, since the seal member 24 is interposed between the base board 21B and the cover board 31A, the accommodation space 11 which is formed between the base board 21B and the cover board 31A can be improved in air-tightness.

Further, in the present embodiment, like in the first embodiment, by giving the seal member 24 electrical conductivity, it is possible to suppress deterioration or damage of the electronic circuit of the die 90 due to ESD at the above-mentioned disassembly step (step S40 of FIG. 1).

Note that, when the die 90 is relatively thick, the cover board 31A may be laid over the base board 21B so that the base board 21B and the cover frame 32 face each other across the seal member 24.

Fourth Embodiment

Figure 18:
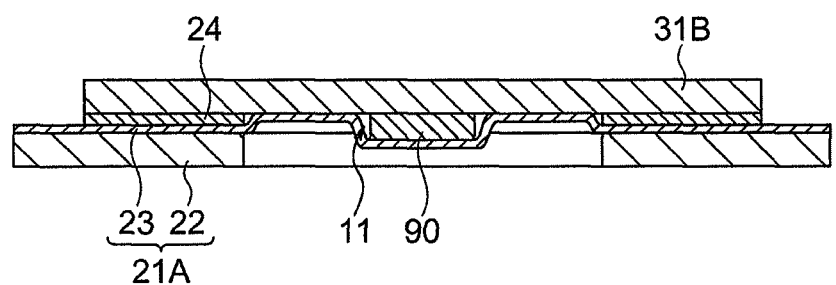
FIG. 18 is a cross-sectional view which shows a test carrier in a fourth embodiment of the present invention.

FIG. 18 is a view which shows a test carrier in a fourth embodiment of the present invention.

In the present embodiment, the configuration of the cover board differs from the first embodiment, but the rest of the configuration is similar to the first embodiment.

As shown in FIG. 18, the cover board 31B in the present embodiment has a high rigidity (a rigidity higher than at least the base film 23), but comprises only a flat plate shaped rigid board which does not have a center opening. This cover board 31B is, for example, composed of a polyamide imide resin, ceramic, glass, etc.

In this embodiment as well, the seal member 24 is interposed between the base board 21A and the cover board 31B, and the die 90 which is held between the base board 21A and the cover board 31B is surrounded by the ring-shaped seal member 24. Note that, as explained in the first embodiment, an adhesive member may be used to adhere the seal member 24 to the base board 21A or the cover board 31B in advance.

In the present embodiment, like in the first embodiment, since the seal member 24 is interposed between the base board 21A and the cover board 31B, the accommodation space 11 which is formed between the base board 21A and the cover board 31B can be improved in air-tightness.

Further, in the present embodiment, like in the first embodiment, by giving the seal member 24 electrical conductivity, it is possible to suppress deterioration or damage of the electronic circuit of the die 90 due to ESD at the above-mentioned disassembly step (step S40 of FIG. 1).

Note that, when the die 90 is relatively thick, the cover board 31B may be laid over the base board 21A so that the base frame 22 and the cover board 31B face each other across the seal member 24.

Fifth Embodiment

Figure 19:
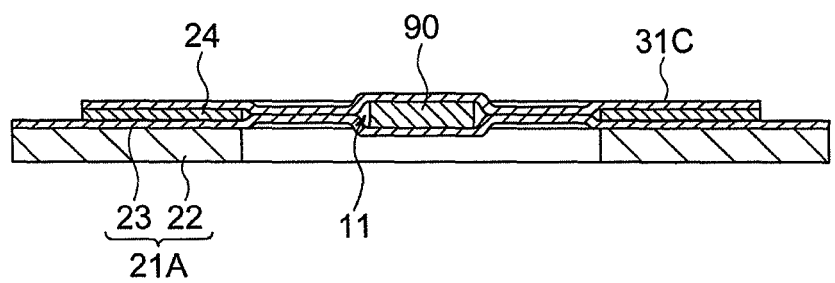
FIG. 19 is a cross-sectional view which shows a test carrier in a fifth embodiment of the present invention.

FIG. 19 is a view which shows a test carrier in a fifth embodiment of the present invention.

In the present embodiment, the configuration of the cover board differs from the first embodiment, but the rest of the configuration is similar to the first embodiment.

As shown in FIG. 19, the cover board 31C in the present embodiment comprises only the above-mentioned cover film 33.

In this embodiment as well, the seal member 24 is interposed between the base board 21A and the cover board 31C, and the die 90 which is held between the base board 21A and the cover board 31C is surrounded by the ring-shaped seal member 24. Note that, as explained in the first embodiment, an adhesive member may be used to adhere the seal member 24 to the base board 21A or the cover board 31C in advance.

In the present embodiment, like in the first embodiment, since the seal member 24 is interposed between the base board 21A and the cover board 31C, the accommodation space 11 which is formed between the base board 21A and the cover board 31C can be improved in air-tightness.

Further, in the present embodiment, like in the first embodiment, by giving the seal member 24 electrical conductivity, it is possible to suppress deterioration or damage of the electronic circuit of the die 90 due to ESD at the above-mentioned disassembly step (step S40 of FIG. 1).

Note that, when the die 90 is relatively thick, the cover board 31C may be laid over the base board 21A so that the base frame 22 faces the cover board 31C across the seal member 24.

Sixth Embodiment

Figure 20:
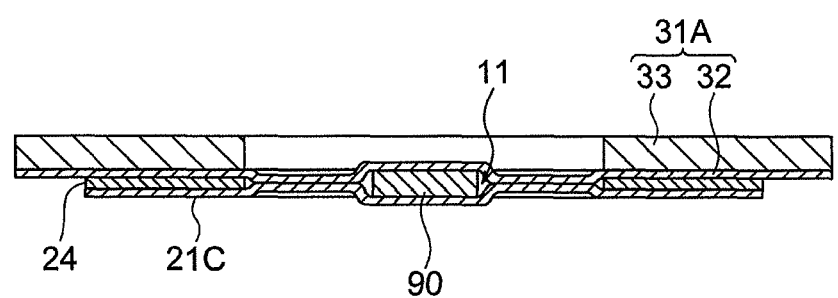
FIG. 20 is a cross-sectional view which shows a test carrier in a sixth embodiment of the present invention.

FIG. 20 is a view which shows a test carrier in a sixth embodiment of the present invention.

In the present embodiment, the configuration of the base board differs from the first embodiment, but the rest of the configuration is similar to the first embodiment.

As shown in FIG. 20, the base board 21C in the present embodiment comprises only the above-mentioned base film 23.

In this embodiment as well, the seal member 24 is interposed between the base board 21C and the cover board 31A, and the die 90 which is held between the base board 21C and the cover board 31A is surrounded by the ring-shaped seal member 24. Note that, as explained in the first embodiment, an adhesive member may be used to adhere the seal member 24 to the base board 21C or the cover board 31A in advance.

In the present embodiment, like in the first embodiment, since the seal member 24 is interposed between the base board 21C and the cover board 31A, the accommodation space 11 which is formed between the base board 21C and the cover board 31A can be improved in air-tightness.

Further, in the present embodiment, like in the first embodiment, by giving the seal member 24 electrical conductivity, it is possible to suppress deterioration or damage of the electronic circuit of the die 90 due to ESD at the above-mentioned disassembly step (step S40 of FIG. 1).

Note that, when the die 90 is relatively thick, the cover board 31A may be laid over the base board 21C so that the cover frame 32 faces the base board 21C across the seal member 24.

Seventh Embodiment

Figure 21:
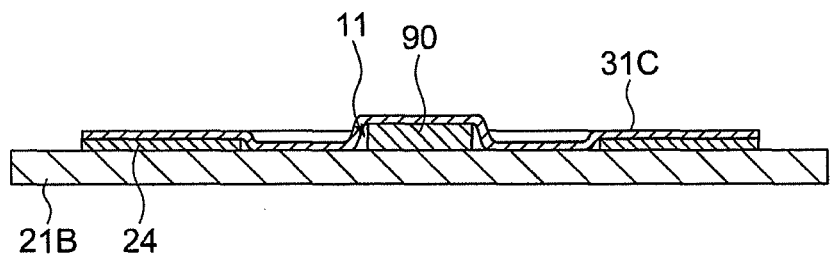
FIG. 21 is a cross-sectional view which shows a test carrier in a seventh embodiment of the present invention.

FIG. 21 is a view which shows a test carrier in a seventh embodiment of the present invention.

The test carrier of the present embodiment comprises the base board 21B which was explained in the third embodiment (see FIG. 17) and the cover board 31C which was explained in the fifth embodiment (see FIG. 19).

In this embodiment as well, the seal member 24 is interposed between the base board 21B and the cover board 31C, and the die 90 which is held between the base board 21B and the cover board 31C is surrounded by the ring-shaped seal member 24. Note that, as explained in the first embodiment, an adhesive member may be used to adhere the seal member 24 to the base board 21B or the cover board 31C in advance.

In the present embodiment, like in the first embodiment, since the seal member 24 is interposed between the base board 21B and the cover board 31C, the accommodation space 11 which is formed between the base board 21B and the cover board 31C can be improved in air-tightness.

Further, in the present embodiment, like in the first embodiment, by giving the seal member 24 electrical conductivity, it is possible to suppress deterioration or damage of the electronic circuit of the die 90 due to ESD at the above-mentioned disassembly step (step S40 of FIG. 1).

Eighth Embodiment

Figure 22:
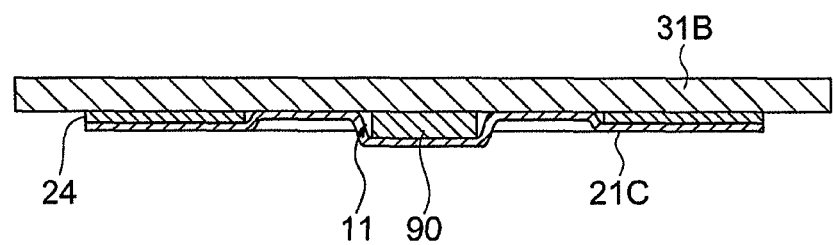
FIG. 22 is a cross-sectional view which shows a test carrier in an eighth embodiment of the present invention.

FIG. 22 is a view which shows a test carrier in an eighth embodiment of the present invention.

The test carrier of the present embodiment comprises the base board 21C which was explained in the sixth embodiment (see FIG. 20) and the cover board 31B which was explained in the fourth embodiment (see FIG. 18).

In this embodiment as well, the seal member 24 is interposed between the base board 21C and the cover board 31B, and the die 90 which is held between the base board 21C and the cover board 31B is surrounded by the ring-shaped seal member 24. Note that, as explained in the first embodiment, an adhesive member may be used to adhere the seal member 24 to the base board 21C or the cover board 31B in advance.

In the present embodiment, like in the first embodiment, since the seal member 24 is interposed between the base board 21C and the cover board 31B, the accommodation space 11 which is formed between the base board 21C and the cover board 31B can be improved in air-tightness.

Further, in the present embodiment, like in the first embodiment, by giving the seal member 24 electrical conductivity, it is possible to suppress deterioration or damage of the electronic circuit of the die 90 due to ESD at the above-mentioned disassembly step (step S40 of FIG. 1).

Ninth Embodiment

Figure 23:
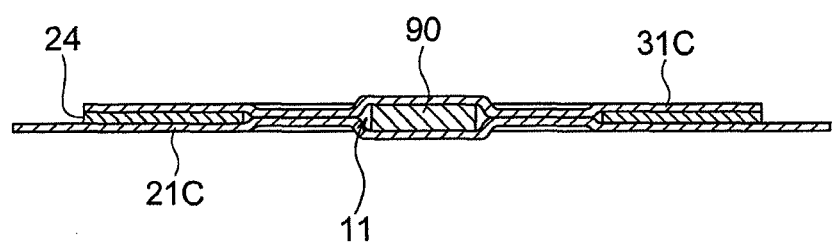
FIG. 23 is a cross-sectional view which shows a test carrier in a ninth embodiment of the present invention.

FIG. 23 is a view which shows a test carrier in a ninth embodiment of the present invention.

The test carrier of the present embodiment comprises the base board 21C which was explained in the sixth embodiment (see FIG. 20) and the cover board 31C which was explained in the fifth embodiment (see FIG. 19).

In this embodiment as well, the seal member 24 is interposed between the base board 21C and the cover board 31C, and the die 90 which is held between the base board 21C and the cover board 31C is surrounded by the ring-shaped seal member 24. Note that, as explained in the first embodiment, an adhesive member may be used to adhere the seal member 24 to the base board 21C or the cover board 31C in advance.

In the present embodiment, like in the first embodiment, since the seal member 24 is interposed between the base board 21C and the cover board 31C, the accommodation space 11 which is formed between the base board 21C and the cover board 31C can be improved in air-tightness.

Further, in the present embodiment, like in the first embodiment, by giving the seal member 24 electrical conductivity, it is possible to suppress deterioration or damage of the electronic circuit of the die 90 due to ESD at the above-mentioned disassembly step (step S40 of FIG. 1).

Note that the embodiments explained above were described for facilitating understanding of the present invention and were not described for limiting the present invention. Therefore, the elements disclosed in the above embodiments include all design modifications and equivalents falling under the technical scope of the present invention.

For example, in the second to ninth embodiments which are shown in FIG. 14 to FIG. 23, the conduction paths such as shown in FIG. 8 to FIG. 12 may also be employed. Further, in the third to ninth embodiments which are shown in FIG. 17 to FIG. 23, instead of the seal member 24, the seal member 34 which is explained in the second embodiment may be employed.

Further, the relationship of the sizes of the base board and the cover board in the first to ninth embodiments is not particularly limited. The base board may be made larger than the cover board or the base board may be made smaller than the cover board. Alternatively, the base board and the cover board may be made the same sizes.

REFERENCE SIGNS LIST 10A, 10B . . . test carrier
11 . . . accommodation space
20 . . . base board assembly
21A to 21C . . . base board
22 . . . base frame
23 . . . base film
24 . . . seal member
241 . . . inside hole
25 . . . adhesive member
30 . . . cover board assembly
31A to 31C . . . cover board
32 . . . cover frame
33 . . . cover film
34 . . . seal member
341 . . . inside hole
342 . . . inner circumferential groove
90 . . . die

The invention claimed is:

1. A test carrier comprising:
   a base board which directly holds an electronic device;
   a cover board which is laid over the base board so as to cover an upper surface of the electronic device; and
   a seal member which is interposed between the base board and the cover board and surrounds the electronic device,
   wherein the seal member comprises a ring-shaped elastic member,
   the ring-shaped elastic member has:
   an inside hole winch is formed to penetrate an upper surface and a lower surface of the ring-shaped elastic member; and
   an inner groove which is formed to open to the inside hole over a whole circumference of the inside hole, and
   part of the cover board is inserted in the inner groove.

2. The test carrier as set forth in claim 1, wherein the base board has a flat part, which contacts the seal member.

3. The test carrier as set forth in claim 1, wherein the electronic device is a die which is formed by dicing a semiconductor wafer.

4. The test carrier as set forth in claim 1, wherein an accommodation space which is formed between the base board and the cover board and which accommodates the electronic device is reduced in pressure compared with the outside air.

5. The test carrier as set forth in claim 1, wherein the ring-shaped elastic member contains conductors so that the seal member has electrical conductivity.

6. A board assembly of a test carrier, the board assembly comprising:
   a cover board which is to cover an upper surface of an electronic device; and
   a seal member, wherein
   the seal member comprises a ring-shaped elastic member,
   the ring-shaped elastic member has:
   an inside hole which is formed to penetrate an upper surface and a lower surface of the ring-shaped elastic member, and
   an inner groove which is formed to open to the inside hole over a whole circumference of the inside hole, and
   part of the cover board is inserted in the inner groove.

7. The board assembly as set forth in claim 6, wherein the ring-shaped elastic member contains conductors so that the seal member has electrical conductivity.

\* \* \* \* \*